United States Patent
Shibata et al.

(10) Patent No.: US 8,004,163 B2
(45) Date of Patent: Aug. 23, 2011

(54) SUBSTRATE WITH A PIEZOELECTRIC THIN FILM

(75) Inventors: Kenji Shibata, Tsukuba (JP); Fumihito Oka, Tsuchiura (JP)

(73) Assignee: Hitachi Cable, Ltd, Tokyo (JP)

( * ) Notice: Subject to any disclaimer, the term of this patent is extended or adjusted under 35 U.S.C. 154(b) by 0 days.

(21) Appl. No.: 12/656,975

(22) Filed: Feb. 22, 2010

(65) Prior Publication Data

US 2010/0156247 A1  Jun. 24, 2010

Related U.S. Application Data

(63) Continuation of application No. 12/073,237, filed on Mar. 3, 2008, now Pat. No. 7,710,003.

(30) Foreign Application Priority Data

Oct. 15, 2007 (JP) .................................. 2007-267858

(51) Int. Cl.
*H01L 41/187* (2006.01)
(52) U.S. Cl. .......................... 310/358; 310/330; 310/346
(58) Field of Classification Search .................. 310/330, 310/346, 358
See application file for complete search history.

(56) References Cited

U.S. PATENT DOCUMENTS

| | | | |
|---|---|---|---|
| 2,976,246 A | 3/1961 | Egerton et al. | |
| 5,796,152 A | 8/1998 | Carr et al. | |
| 7,267,840 B2 | 9/2007 | Ohnishi et al. | |
| 7,323,806 B2 | 1/2008 | Shibata et al. | |
| 7,372,191 B2 | 5/2008 | Ohmori et al. | |
| 7,443,080 B2 | 10/2008 | Yoshioka et al. | |
| 7,652,412 B2 * | 1/2010 | Nihei | 310/346 |
| 7,701,121 B2 * | 4/2010 | Oka et al. | 310/358 |
| 7,710,003 B2 * | 5/2010 | Shibata et al. | 310/358 |
| 2004/0012308 A1 | 1/2004 | Riedel | |
| 2004/0070314 A1 | 4/2004 | Yoon et al. | |
| 2004/0214723 A1 | 10/2004 | Nonoyama et al. | |
| 2007/0126313 A1 | 6/2007 | Ueno et al. | |
| 2007/0228874 A1 | 10/2007 | Nagaya et al. | |

FOREIGN PATENT DOCUMENTS

JP  2006-291332 A  10/2006
JP  2007-19302  1/2007

* cited by examiner

*Primary Examiner* — Thomas M Dougherty
(74) *Attorney, Agent, or Firm* — McGinn IP Law Group, PLLC

(57) ABSTRACT

A substrate has a first thermal expansion coefficient and a piezoelectric thin film has a second thermal expansion coefficient. The piezoelectric thin film is mainly composed of a potassium sodium niobate $(K,Na)NbO_3$ with a perovskite structure. A curvature radius of a warping of the substrate provided with the piezoelectric thin film due to difference between the first and the second thermal expansion coefficients is 10 m or more at room temperature. The piezoelectric thin film has a thickness of 0.2 μm to 10 μm. The piezoelectric thin film is oriented in one of plane orientations (001), (110), and (111).

12 Claims, 8 Drawing Sheets

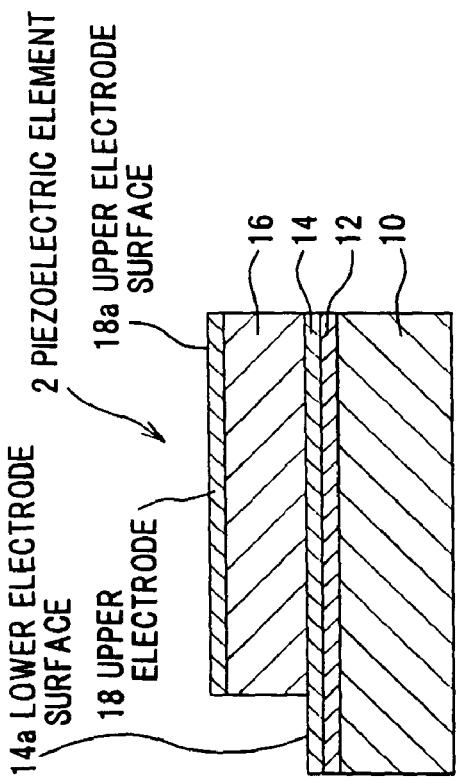
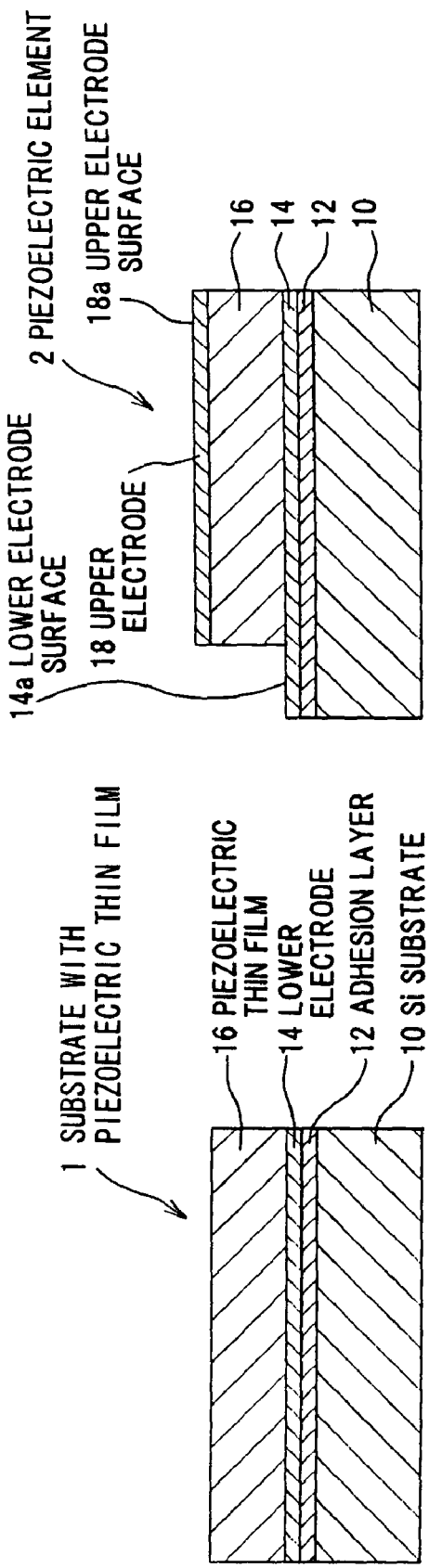

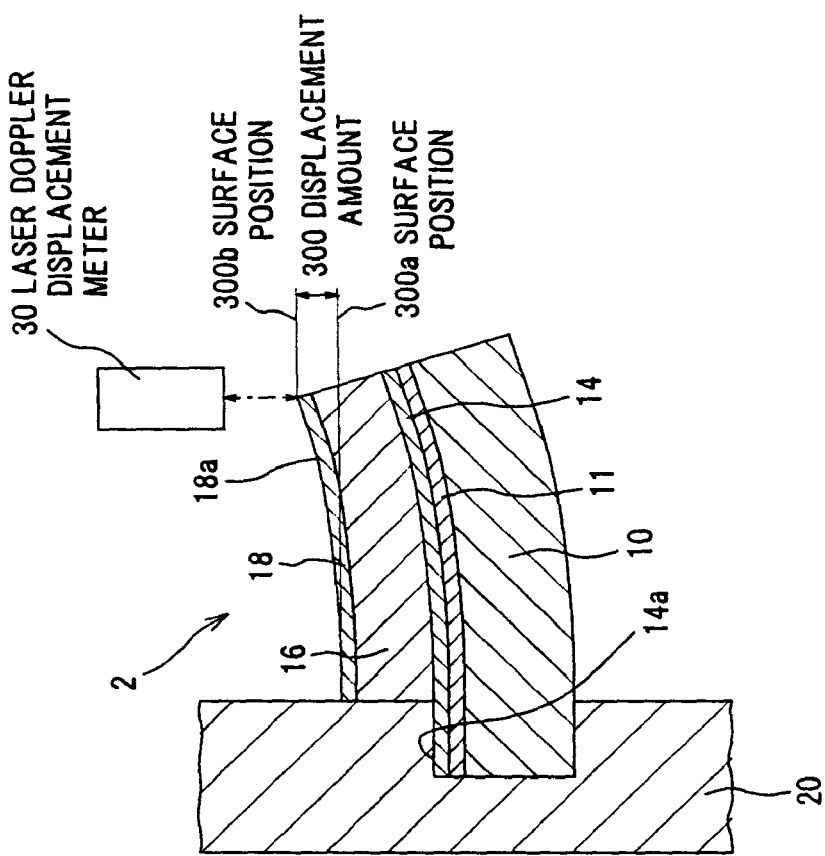
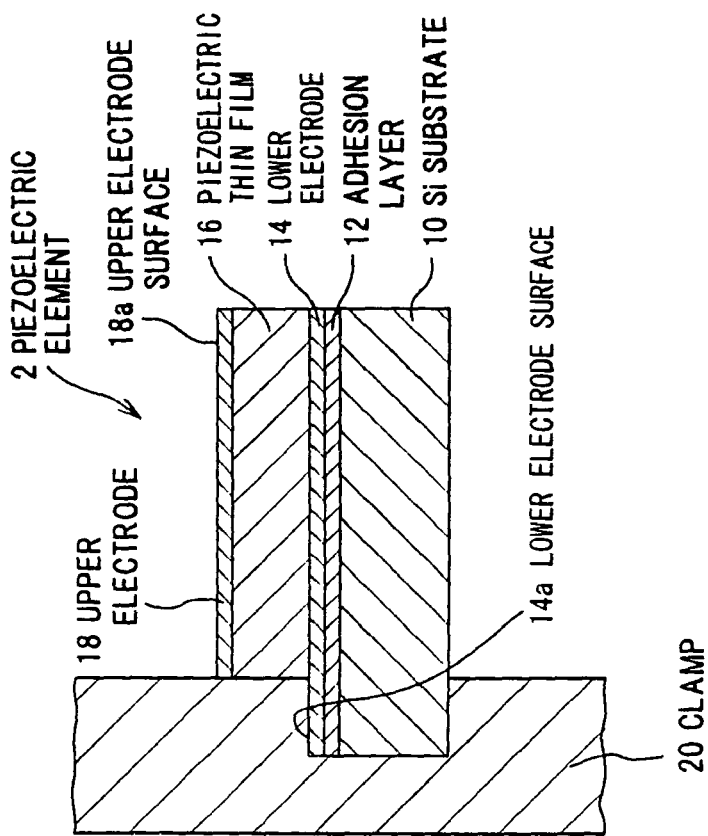

SUBSTRATE WITH A PIEZOELECTRIC THIN FILM

The present application is a Continuation Application of U.S. patent application Ser. No. 12/073,237, filed on Mar. 3, 2008, now U.S. Pat. No. 7,710,003 which is based on and claims priority from Japanese patent application No. 2007-267858, filed on Oct. 15, 2007, the entire contents of which are incorporated herein by reference.

BACKGROUND OF THE INVENTION

1. Field of the Invention

The present invention relates to a substrate with a piezoelectric thin film, particularly to a Pb-free substrate with a piezoelectric thin film.

2. Related Art

A piezoelectric element having a piezoelectric material is used for an actuator or a sensor etc. A $Pb(Zr_{1-x}Ti_x)O_3$ based perovskite-type ferroelectric substance (piezoelectric lead zirconium titanate: PZT) has been widely used as a piezoelectric material for forming such a piezoelectric element. However, since the PZT contains lead (Pb), it is desired to use a piezoelectric material containing no lead, i.e. a Pb-free piezoelectric material for a piezoelectric element from a consideration of environmental point of view.

As a conventional Pb-free piezoelectric thin film element, for instance, there is a piezoelectric thin film element using a dielectric film comprising an alkali niobium oxide based perovskite compound. This piezoelectric thin film element comprises a substrate comprising MgO etc., a lower electrode formed on the substrate, a buffer layer comprising $BaTiO_3$ etc. and formed on the lower electrode, a piezoelectric thin film comprising an alkali niobium oxide based perovskite compound expressed by a general formula of $(Na_xK_yLi_z)NbO_3$ ($0<x<1$, $0<y<1$, and $x+y+z=1$) and formed on the buffer layer, and an upper electrode formed on the piezoelectric thin film. For instance, Japanese Patent Laid-Open No. 2007-19302 (JP-A-2007-19302) discloses this type of Pb-free piezoelectric thin film element.

However, in the piezoelectric thin film element according to JP-A-2007-19302, a warping might be generated in the piezoelectric thin film element when forming the piezoelectric thin film comprising a potassium sodium niobate based material on the substrate of MgO etc. If a piezoelectric operation is continuously conducted for a long period in such a warped piezoelectric thin film element, a piezoelectric constant $d_{31}$ of the piezoelectric thin film element will be decreased greatly.

THE SUMMARY OF THE INVENTION

Therefore, it is an object of the invention to provide a substrate with a piezoelectric thin film, by which it is possible to suppress the decrease in the piezoelectric constant $d_{31}$ of the piezoelectric element even after the piezoelectric operation is continuously conducted for a long period in the piezoelectric element comprising the substrate with the piezoelectric thin film comprising a Pb-free piezoelectric material.

According to a feature of the invention, a substrate with a piezoelectric thin film comprises:

the substrate having a first thermal expansion coefficient; and the piezoelectric thin film having a second thermal expansion coefficient and being formed above the substrate, the piezoelectric thin film comprising a potassium sodium niobate expressed by a general formula $(K,Na)NbO_3$ with a perovskite structure, wherein a curvature radius of a warping of the substrate provided with the piezoelectric thin film due to a deference between the first and the second thermal expansion coefficients is 10 m or more at a room temperature.

In the substrate with the piezoelectric thin film, the piezoelectric thin film may have a thickness of 0.2 μm to 10 μm. The substrate may comprise a Si substrate. The substrate may comprise a Ge substrate. The substrate may comprise a GaAs substrate.

The substrate with the piezoelectric thin film may further comprise:

a lower electrode between the piezoelectric thin film and the substrate; and an upper electrode on an opposite surface of the piezoelectric thin film with respect to a surface contacting with the lower electrode, wherein at least one of the upper electrode and the lower electrode contains Pt.

The substrate with the piezoelectric thin film may further comprise a layer having a perovskite structure between the lower electrode and the piezoelectric thin film. The layer having the perovskite structure may comprise a compound selected from a group consisting of $KNbO_3$, $NaNbO_3$, $LaNiO_3$, $SrRuO_3$, and $SrTiO_3$.

In the substrate with the piezoelectric thin film, the piezoelectric thin film may comprise $(K,Na)NbO_3$ having a composition within a range of $0.4<Na/(K+Na)<0.75$. The piezoelectric thin film may contain an element other than K, Na, Nb, and O. A content of the other element in the piezoelectric thin film is 10% or less. The other element is lithium or tantalum.

In the substrate with the piezoelectric thin film, the piezoelectric thin film is oriented in one of plane orientations (001), (110), and (111). The $(K,Na)NbO_3$ composing the piezoelectric thin film has an average grain size within a range of 0.1 μm to 1.0 μm.

EFFECT OF THE INVENTION

According to the present invention, it is possible to control the decrease in the piezoelectric constant $d_{31}$ of the piezoelectric element even after the piezoelectric operation is continuously operated for a long period in the piezoelectric element comprising the substrate with the piezoelectric thin film comprising the Pb-free piezoelectric material.

BRIEF DESCRIPTION OF THE DRAWINGS

Next, the present invention will be explained in more detail in conjunction with appended drawings, wherein:

FIGS. 1A and 1B are diagrams showing a substrate with a piezoelectric thin film and a piezoelectric element in a first preferred embodiment according to the present invention, wherein FIG. 1A is a cross sectional view of the substrate with the piezoelectric thin film and FIG. 1B is a cross sectional view of the piezoelectric element;

FIGS. 4A and 4B are schematic diagrams showing an evaluation method of the piezoelectric characteristic of the piezoelectric elements in the first preferred embodiment and the comparative example;

DESCRIPTION OF THE PREFERRED EMBODIMENTS

First Preferred Embodiment

Figure 2:
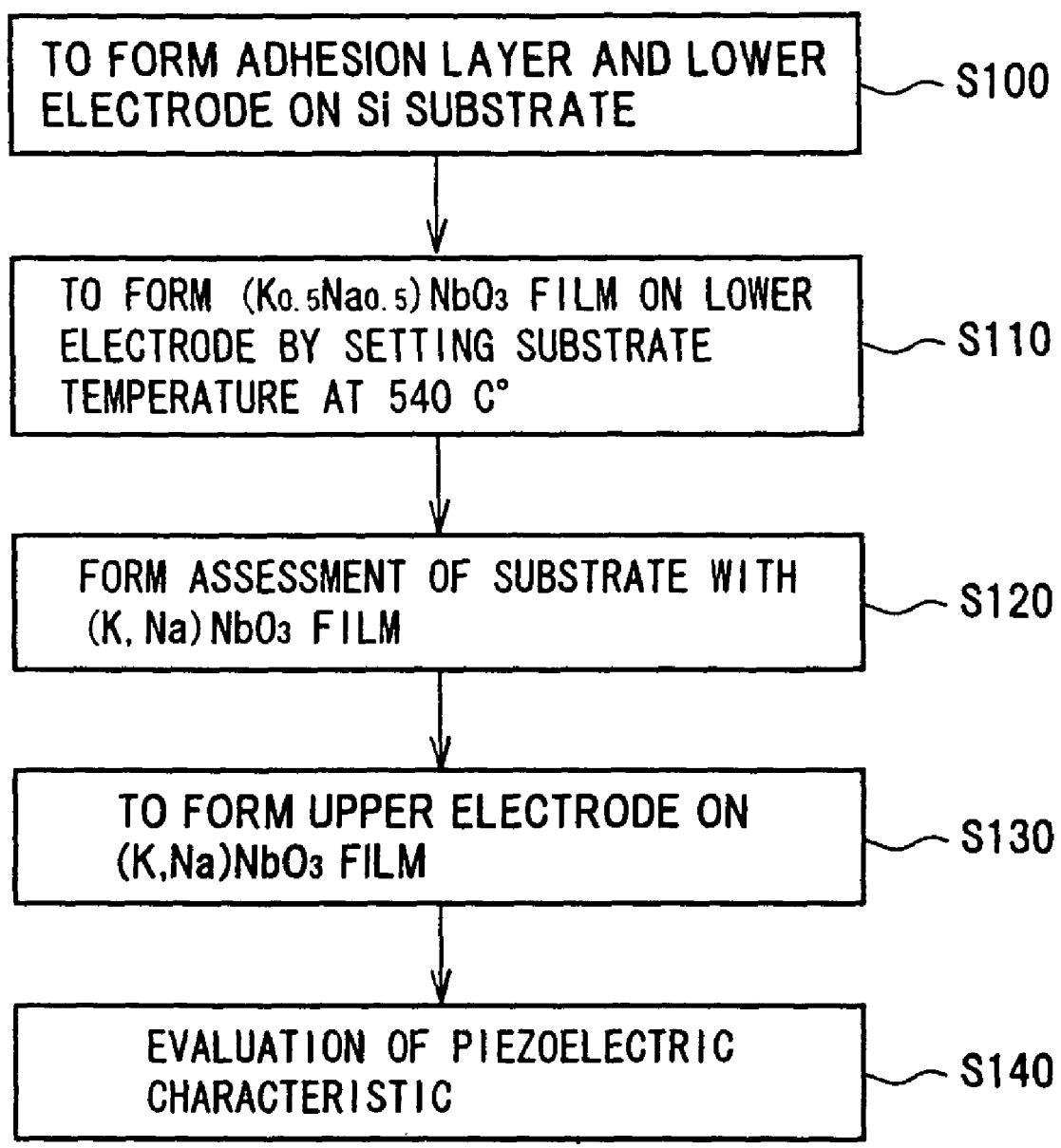
FIG. 2 is a flow chart showing a manufacturing process of the substrate with the piezoelectric thin film and the piezoelectric element, and a characteristic evaluation process thereof in the first preferred embodiment.

FIGS. 1A and 1B are diagrams showing a substrate with a piezoelectric thin film and a piezoelectric element in a first preferred embodiment according to the present invention, wherein FIG. 1A is a cross sectional view of the substrate with the piezoelectric thin film and FIG. 1B is a cross sectional view of the piezoelectric element.

In the first preferred embodiment, a substrate 1 with a piezoelectric thin film comprises a silicon (Si) substrate 10 having a plane orientation (100) as a substrate, an adhesion layer 12 formed on the Si substrate 10, a lower electrode 14 formed on the adhesion layer 12, and a piezoelectric thin film 16 formed on the lower electrode 14 as shown in FIG. 1A.

For instance, the Si substrate 10 is formed to have a substantially square shape of 20 mm×20 mm in plan view, and a thermally-oxidized film is formed on a surface of the Si substrate 10. Then, the Si substrate 10 having a thickness of 0.5 mm, for instance, is used in this embodiment. Further, the adhesion layer 12 is provided between the Si substrate 10 and the lower electrode 14, and the adhesion layer 12 comprises a metallic material such as titanium (Ti). The adhesion layer 12 comprises Ti having a thickness of 2 nm, for instance. The lower electrode 14 comprises a conductive material containing a metallic material such as platinum (Pt). The lower electrode 14 comprises Pt having a film thickness of 0.2 μm (preferred orientation (111)), for instance. By providing the lower electrode 14 comprising Pt, it is possible to form the piezoelectric thin film 16 having a high orientation on the lower electrode 14.

The piezoelectric thin film 16 comprises a Pb-free piezoelectric material having a perovskite structure. The piezoelectric thin film 16 is formed to have a film thickness within a range of 0.2 μm to 10 μm. The piezoelectric thin film 16 comprises potassium sodium niobate having a film thickness of 3 μm, for instance. The potassium sodium niobate is expressed by a general formula of $(K,Na)NbO_3$, and the piezoelectric thin film 16 in this preferred embodiment may comprise the potassium sodium niobate expressed by a general formula of $(K_{0.5}Na_{0.5})NbO_3$, for instance. The piezoelectric thin film 16 is formed to have one of plane orientations (001), (110) and (111).

When the thickness of the piezoelectric thin film 16 is less than 0.2 μm, the piezoelectric thin film 16 hardly functions as a sensor or an actuator. Further, when the thickness of the piezoelectric thin film 16 is more than 10 μm, the film formation of the piezoelectric thin film 16 is substantially difficult. For these reasons, as mentioned above, it is preferable that the piezoelectric thin film 16 is formed to have the film thickness within the range of 0.2 μm to 10 μm.

Further, for instance, the piezoelectric thin film 16 is formed such that an average grain size of the piezoelectric material composing the piezoelectric thin film 16 is within the range of 0.1 μm to 1.0 μm. Miniaturization and high performance of the piezoelectric element comprising the substrate 1 with a piezoelectric thin film is required in accordance with the miniaturization and the high performance of the electronic components using the piezoelectric element. Namely, in case that the piezoelectric thin film 16 is formed to have the thickness of about 3 μm to 5 μm, for instance, when the grain size of the piezoelectric material composing the piezoelectric thin film 16 is close to the film thickness of the piezoelectric thin film 16, the piezoelectric characteristic inside the piezoelectric thin film 16 varies and the piezoelectric thin film 16 is also remarkably deteriorated. Therefore, it is preferable that the average grain size of the piezoelectric material composing the piezoelectric thin film 16 is sufficiently smaller than the film thickness of the piezoelectric thin film 16.

Further, for the purpose of forming the piezoelectric thin film 16 having the predetermined piezoelectric constant which can be practically used, the piezoelectric thin film 16 comprises $(K,Na)NbO_3$ having a composition, in which the value of $Na/(K+Na)$ is within the range of 0.4 to 0.75. $(K,Na)NbO_3$ as the piezoelectric material composing the piezoelectric thin film 16 may contain other elements than potassium (K), sodium (Na), niobium (Nb), and oxygen (O) which are elements composing the piezoelectric material. For instance, $(K,Na)NbO_3$ as the piezoelectric material composing the piezoelectric thin film 16 may contain lithium (Li) or tantalum (Ta) with 10% or less of the content, which is an upper limit that the piezoelectric constant of the piezoelectric thin film 16 is not lowered.

In this preferred embodiment, a thermal expansion coefficient (a second thermal expansion coefficient) of the piezoelectric thin film 16 comprising the potassium sodium niobate is from $5.5 \times 10^{-6}$/°C. to $6.5 \times 10^{-6}$/°C. and a thermal expansion coefficient (a first thermal expansion coefficient) of Si composing the Si substrate 10 is $2.6 \times 10^{-6}$/°C. Namely, the thermal expansion coefficient of the Si substrate 10 and that of the piezoelectric thin film 16 are greatly different from each other.

It is possible to further provide a buffer layer between the lower electrode 14 and the piezoelectric thin film 16 in the substrate 1 with the piezoelectric thin film. The buffer layer comprises a material, in which a crystal having the perovskite structure is easily oriented in one of plane orientations of (001), (100), (110), (010), and (111). For instance, the buffer layer comprises a compound having the perovskite structure which is expressed by a chemical formula of $KNbO_3$, $NaNbO_3$, $LaNiO_3$, $SrRuO_3$, or $SrTiO_3$ etc.

The piezoelectric thin film 16 is formed on the buffer layer to be oriented in one of plane orientations of (001), (100), (110), (010), and (111) at a predetermined rate by forming the aforementioned buffer layer on the lower electrode 14. Further, it is possible to improve the crystalline property of the layer formed on the buffer layer by providing the buffer layer on the lower electrode 14.

Next, as shown in FIG. 1B, according to the first preferred embodiment, the piezoelectric element 2 has a configuration in which an upper electrode 18 is further formed on the piezoelectric thin film 16 provided on the substrate 1 and a portion of the surface of the lower electrode 14 is exposed. It is possible to activate the piezoelectric element 2 by applying a predetermined voltage between a surface 18a of the upper electrode 18 and a surface 14a of the lower electrode 14.

The upper electrode 18 in this preferred embodiment comprises a metallic material, for instance, Pt with a film thickness of 0.02 μm. The piezoelectric element 2 is formed to have a strip-shape with a length of 20 mm and a width of 2.5 mm. It is possible to form the upper electrode 18 from a compound containing a metallic material other than Pt.

FIG. 2 is a flow chart showing a manufacturing process of the substrate with the piezoelectric thin film and the piezoelectric element, and a characteristic evaluation process thereof in the first preferred embodiment.

(Method for Manufacturing the Substrate 1 with the Piezoelectric Thin Film and the Piezoelectric Element 2 as well as Characteristic Evaluation thereof)

Firstly, the adhesion layer 12 comprising Ti with a film thickness of 2 nm and the lower electrode 14 comprising Pt with a film thickness of 0.2 μm (preferred orientation (111)) are sequentially formed on the Si substrate 10 provided with a thermally-oxidized film ((110) plane orientation, a thickness of 0.5 mm, 20 mm×20 mm in square) by using an RF magnetron sputtering method (S100).

The film formation condition for the adhesion layer 12 and the lower electrode 14 is as follows. Namely, the adhesion layer 12 and the lower electrode 14 are sequentially grown in this order by setting a substrate temperature at 350° C. with a discharge power of 200 W in an Ar introduced gas atmosphere under a pressure of 2.5 Pa. The film formation time is set for 1 minute for the adhesion layer 12 and 10 minutes for the lower electrode 14.

Next, the piezoelectric thin film 16 is formed on the lower electrode 14 under a predetermined film formation condition. Concretely, a $(K_{0.5}Na_{0.5})NbO_3$ film having a thickness of 3 μm is formed on the lower electrode 14 by using the RF magnetron sputtering method (S110). As a result, the substrate 1 with the piezoelectric thin film is formed.

The predetermined film formation condition of the piezoelectric thin film 16 by using the RF magnetron sputtering method is as follows. Namely, the piezoelectric thin film 16 is formed by setting a substrate temperature of the Si substrate 10 having the lower electrode 14 at 540° C. with a discharge power of 100 W in the Ar introduced gas atmosphere under a pressure of 0.4 Pa. In this preferred embodiment, the substrate temperature is set lower than a temperature generally used for the formation of the potassium sodium niobate film by a sputtering method or PLD (Pulsed Laser Deposition) method (600° C. or more, for instance, 680° C.).

Further, the film formation time of the piezoelectric thin film 16 is set for 4 hours. A sintered member of $(K,Na)NbO_3$ having a composition which satisfies relations of $(K+Na)/Nb=1.0$ and $K/(K+Na)=0.5$ is used as a target for the RF magnetron sputtering method.

Next, a shape of the substrate with $(K,Na)NbO_3$ film thus formed is evaluated (S120). Namely, the shape (warping) of the substrate 1 with the piezoelectric thin film is measured by using a laser displacement meter at a room temperature.

Subsequently, the upper electrode 18 comprising the Pt with the thickness of 0.02 μm is formed on the piezoelectric thin film 16, i.e. the $(K,Na)NbO_3$ film formed at the step of (S110) (S130). For instance, the upper electrode 18 is formed by using the RF magnetron sputtering method. Then, the substrate 1 with the piezoelectric thin film on which the upper electrode 18 is sliced to provide the piezoelectric element 2 having the strip-shape with the length of 20 mm and the width of 2.5 mm. Thereafter, the piezoelectric characteristic of the piezoelectric element 2 thus formed is evaluated (S140).

It is possible to form the potassium sodium niobate film by using a PLD method, a MOCVD method, a sol-gel method, an aerosol deposition method, Liquid Phase Epitaxy (LPE) method as well as the sputtering method. Further, the piezoelectric thin film 16 may be formed by mixing a small amount of additives into the potassium sodium niobate film. For instance, Li of 10% or less in atomic concentration may be used as the small amount of additives.

Further, it is possible to omit the process of form assessment after forming the substrate 1 with the piezoelectric thin film (S120) in case that the form assessment is not necessary. In similar manner, it is possible to omit the evaluation process of piezoelectric characteristic (S140) in case that the aforementioned evaluation is not necessary.

Figure 3:
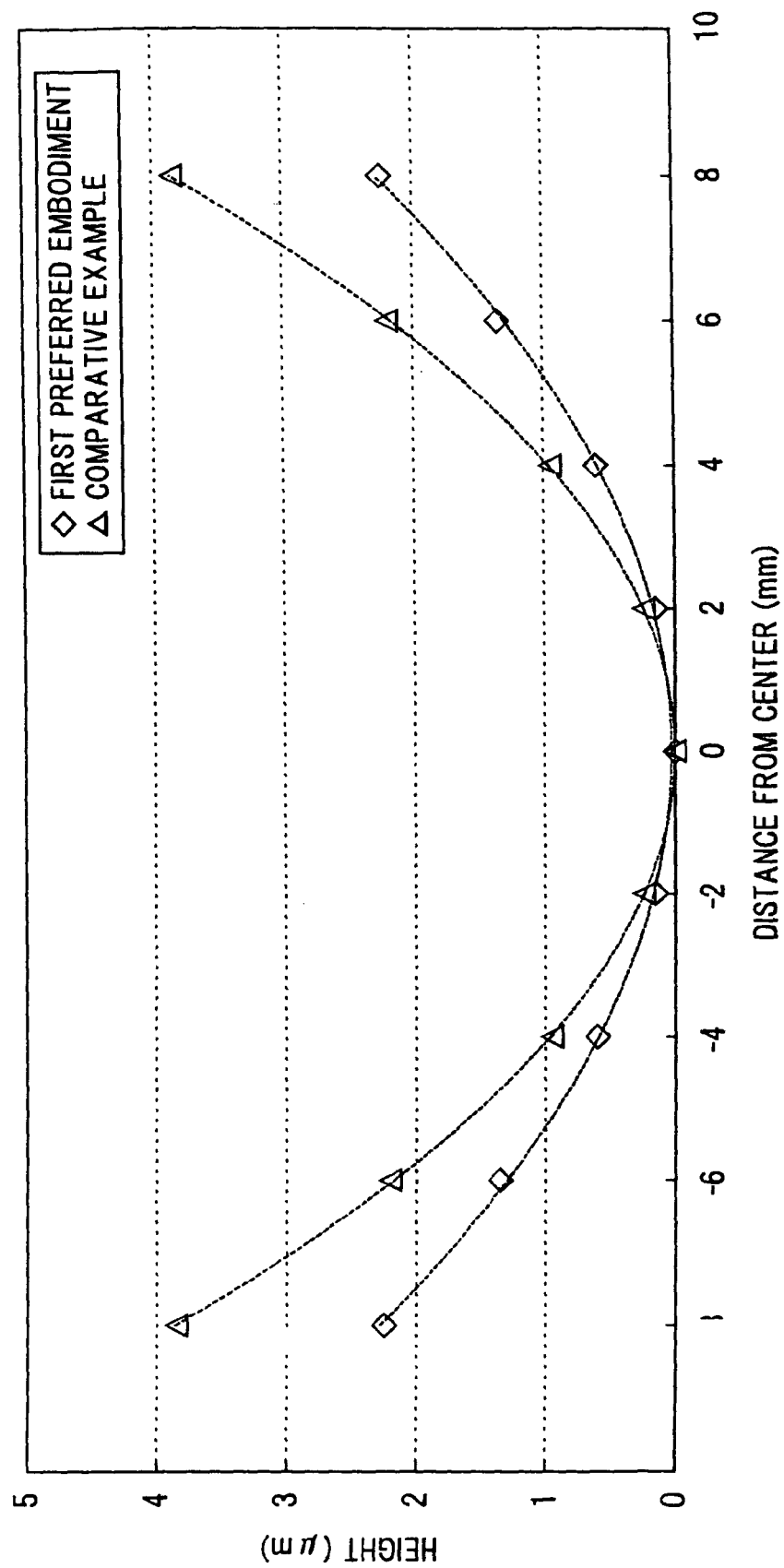
FIG. 3 is a graph chart showing a form assessment result of the substrate with the piezoelectric thin film in the first preferred embodiment and a substrate with a piezoelectric thin film in the comparative example.

FIG. 3 shows a form assessment result of the substrate with the piezoelectric thin film in the first preferred embodiment and a substrate with a piezoelectric thin film in the comparative example.

TABLE 1 shows a comparison between the film formation condition of the piezoelectric thin film in the manufacturing process of the substrate with the piezoelectric thin film in the first preferred embodiment according to the present invention and the film formation condition of the substrate with a piezoelectric thin film in the comparative example.

TABLE 1

| Condition of film formation | First preferred embodiment | Comparative example |
| --- | --- | --- |
| Substrate temperature (° C.) | 540 | 680 |
| Discharge power (W) | 100 | 100 |
| Introduced gas atmosphere | Ar | Ar |
| Pressure (Pa) | 0.4 | 0.4 |
| Time of film formation (hour) | 4 | 4 |
| Target | $(K_{0.5}Na_{0.5})NbO_3$ sintered member | $(K_{0.5}Na_{0.5})NbO_3$ sintered member |

The substrate with the piezoelectric thin film in the comparative example has a same configuration as the substrate 1 with the piezoelectric thin film in the first preferred embodiment. Namely, the substrate with the piezoelectric thin film in the comparative example comprises a silicon (Si) substrate 10 having a (100) plane orientation, an adhesion layer 12 formed on the Si substrate 10, a lower electrode 14 formed on the adhesion layer 12, and a piezoelectric thin film 16 formed on the lower electrode 14 (not shown). Further, since the substrate with the piezoelectric thin film in the comparative example is also manufactured by a substantially same process as that of the substrate 1 with the piezoelectric thin film in the first preferred embodiment, the detailed explanation is omitted except different points.

As shown in TABLE 1, in the substrate with the piezoelectric thin film in the comparative example, the substrate temperature of the Si substrate 10 provided with the lower electrode 14 etc. is set at 680° C. in the film formation condition for forming the piezoelectric thin film 16 on the lower electrode 14. Then, the $(K,Na)NbO_3$ film (the piezoelectric thin film 16) is formed on the lower electrode 14 at the substrate temperature of 680° C.

FIG. 3 shows result of measuring the shape (warping) of the substrate 1 with the piezoelectric thin film in the first preferred embodiment and the substrate with the piezoelectric thin film in the comparative example by using the laser displacement meter. Referring to FIG. 3, both of the substrates in the first preferred embodiment and the comparative example are warped in a convex shape downwards in an arrangement that the (K,Na)NbO$_3$ film (i.e. the piezoelectric thin film 16) is located upwards (i.e. at a top side). Then, a curvature radius of the warping of the substrate 1 with the piezoelectric thin film in the first preferred embodiment is 13.5 m and that of the substrate with the piezoelectric thin film in the comparative example is 8.3 m at the room temperature.

As a result, it is confirmed that the warping of the substrate 1 with the piezoelectric thin film having the piezoelectric thin film 16 comprising the potassium sodium niobate film can be reduced by setting the substrate temperature lower than the normal temperature for forming the potassium sodium niobate film as the piezoelectric thin film 16, compared with the case that the piezoelectric thin film 16 is formed by setting the substrate temperature at the normal temperature.

FIGS. 4A and 4B show the outline of the evaluation method of the piezoelectric constant $d_{31}$ of the piezoelectric elements in the first preferred embodiment and the comparative example.

The piezoelectric constant $d_{31}$ is evaluated for both of the piezoelectric element 2 in the first preferred embodiment and the piezoelectric element in the comparative example. The piezoelectric element in the comparative example is formed from the substrate with a piezoelectric thin film in the comparative example by using the same method as that the method of forming the piezoelectric element 2 from the substrate 1 with the piezoelectric thin film in the first preferred embodiment.

The piezoelectric constant $d_{31}$ is evaluated as follows. Firstly, a simplified unimorph cantilever is composed by fixing an end in a longitudinal direction of the piezoelectric element with a clamp 20 as shown in FIG. 4A. Next, a predetermined voltage is applied to the (K,Na)NbO$_3$ film as the piezoelectric thin film 16 between the upper electrode 18 and the lower electrode 14 in this state. As a result, the (K,Na)NbO$_3$ film expands and contracts so that the whole unimorph lever performs a flexing (bending) action, and an end of the cantilever is operated as shown in FIG. 4B. At this time, a displacement between a surface position 300a of the surface 18a of the upper electrode 15 before applying the voltage and a surface position 300b of the surface 18a of the upper electrode 15 after applying the voltage, and the displacement amount 300 is measured by a laser Doppler displacement meter 30.

The piezoelectric constant $d_{31}$ is calculated from the displacement amount 300, a length of the cantilever, Young's modulus of the Si substrate 10 and the piezoelectric thin film 16, and the applied voltage. The flexing action of the cantilever is repeated for 1,000,000,000 times continuously. Then, a piezoelectric constant (initial piezoelectric constant $d_{31}$) before the flexing action (initial state) and a piezoelectric constant (post-drive piezoelectric constant $d_{31}$) after 1,000,000,000 times of the flexing action are calculated. Continuously, a decreasing rate of the piezoelectric constant $d_{31}$ after 1,000,000,000 times of the flexing action is calculated by a formula of (the initial piezoelectric constant $d_{31}$–the post-drive piezoelectric constant $d_{31}$)/the initial piezoelectric constant $d_{31}$×100%.

TABLE 2 shows a comparison between the decreasing rate of the piezoelectric constant of the piezoelectric element 2 in the first preferred embodiment and that of the piezoelectric element in the comparative example.

TABLE 2

| Piezoelectric element | Decreasing rate of piezoelectric constant $d_{31}$ (%) |
|---|---|
| The first preferred embodiment | 3.3 |
| Comparative example | 7.4 |

On one hand, as for the piezoelectric element in the comparative example, the decreasing rate of the piezoelectric constant $d_{31}$ after 1,000,000,000 times of the flexing action is 7.4%. On the other hand, as for the piezoelectric element 2 in the first preferred embodiment, the decreasing rate of the piezoelectric constant after 1,000,000,000 times of the flexing action is 3.3%.

As a result, in the manufacturing method of the substrate 1 with the piezoelectric thin film in the first preferred embodiment, it is possible to realize the reduction in the decreasing rate of the piezoelectric constant $d_{31}$ by lowering the substrate temperature than the normal temperature when forming the piezoelectric thin film 16. This is because the warping of the substrate 1 with the piezoelectric thin film in the first preferred embodiment is smaller than the warping of the substrate with the piezoelectric thin film in the comparative example, when the substrate temperature is lower than the normal temperature when forming the piezoelectric thin film 16.

Figure 5:
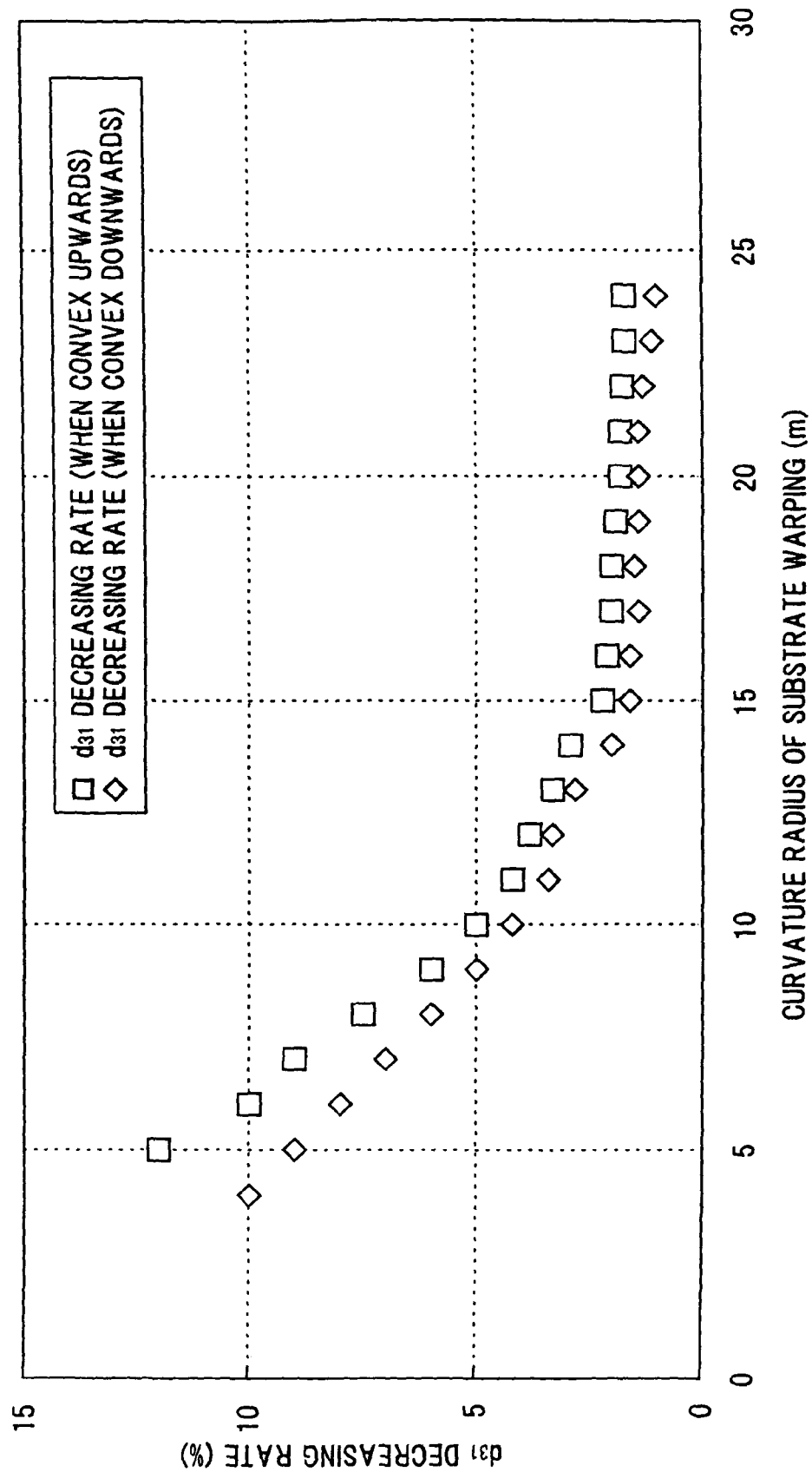
FIG. 5 is a graph chart showing a relationship between a curvature radius of the warping of the substrate with the piezoelectric thin film and a decreasing rate of the piezoelectric constant $d_{31}$.

FIG. 5 shows a relationship between the curvature radius of the warping of the substrate with the piezoelectric thin film and the decreasing rate of the piezoelectric constant $d_{31}$.

Firstly, when forming the potassium sodium niobate film on a predetermined substrate etc. by the sputtering method or the PLD method, the film formation temperature is normally set at 600° C. On this occasion, if the predetermined substrate comprises MgO substrate, SrTiO$_3$ substrate or the like, a compressive stress is generated in the potassium sodium niobate film due to a difference between a thermal expansion coefficient of the potassium sodium niobate film and that of the substrate. As a result, the warping with the convex shape upwards is generated in an arrangement that the potassium sodium niobate film is located upwards (at a top side) and the substrate is located downwards (at a bottom side). The inventor found that the curvature radius of the warping in this case is about 4 m to 7 m at the room temperature.

In the following explanation, the shape of the substrate with the piezoelectric thin film is the shape in the arrangement that the piezoelectric thin film (the potassium sodium niobate film) is located upwards and the substrate is located downwards. Concretely, when the thermal expansion coefficient of the piezoelectric thin film is less than that of the substrate, the shape of the substrate with the piezoelectric thin film is convex downwards. Further, when the thermal expansion coefficient of the piezoelectric thin film is greater than that of the substrate, the shape of the substrate with the piezoelectric thin film is convex upwards.

Further, when using the Si substrate 10 as the substrate and setting the film formation temperature at 600° C. or more, a tensile stress is generated in the potassium sodium niobate film. As a result, the warping with the convex shape downwards is generated in an arrangement that the potassium sodium niobate film is located upwards and the substrate is located downwards. The inventor also found that the curvature radius of the warping in this case is about 6 m to 9 m at the room temperature.

Further, the inventor also found that the piezoelectric constant $d_{31}$ decreases remarkably, when the piezoelectric operation is conducted for long period and continuously for each piezoelectric element comprising the substrate with the piezoelectric thin film formed by using the MgO substrate, the SrTiO₃ substrate, and Si substrate respectively as the substrate and setting the substrate temperature at 600° C. or more which is the normal temperature for the film formation.

On the other hand, samples of the substrate with the potassium sodium niobate piezoelectric thin film having the warping with various curvature radiuses are manufactured, for instance, by setting the substrate temperature at 550° C. or less when forming the piezoelectric thin film. Then, the piezoelectric element is formed from each of the substrates with the piezoelectric thin film. Subsequently, the decreasing rate of the piezoelectric constant $d_{31}$ is calculated in similar manner to the process explained in conjunction with FIGS. 4A and 4B.

As a result, it is confirmed that the decreasing rate of the piezoelectric constant $d_{31}$ after 1,000,000,000 times of the flexing action is 5% or less, when the warping generated in the substrate with the piezoelectric thin film at the room temperature, due to the difference between the thermal expansion coefficient of the piezoelectric thin film comprising the potassium sodium niobate and that of the substrate, has the curvature radius of 10 m or more. This knowledge is obtained as a result of the Inventor's contemplation that the piezoelectric constant $d_{31}$ of the substrate with the piezoelectric thin film is remarkably decreased due to the generation of the warping in the substrate with the piezoelectric thin film by the stress applied to the piezoelectric thin film provided in the substrate with the piezoelectric thin film.

Effect of the First Preferred Embodiment

In the substrate 1 with the piezoelectric thin film in the first preferred embodiment according to the present invention, it is possible to reduce the warping of the substrate 1 with the piezoelectric thin film, since the piezoelectric thin film 16 comprising (K,Na)NbO₃ is formed on the lower electrode 14 by lowering the temperature of the Si substrate 10 having the lower electrode 14 than the usual temperature used for the film formation of the (K,Na)NbO₃, even if the thermal expansion coefficient of the Si substrate 10 and that of the piezoelectric thin film 16 are greatly different from each other. As a result, it is possible to control the decrease in the piezoelectric constant $d_{31}$, even if the piezoelectric operation of the piezoelectric element 2 comprising the substrate 1 with the piezoelectric thin film containing no lead (Pb) is continuously conducted for a long period.

Further, according to the first preferred embodiment, it is possible to provide the substrate with the piezoelectric thin film comprising the Pb-free material having an excellent piezoelectric characteristic in which the decrease in the piezoelectric constant $d_{31}$ is suppressed, by reducing the warping of the substrate with the piezoelectric thin film to have the curvature radius of the warping of the substrate 1 with the piezoelectric thin film to be 10 m or more.

Second Preferred Embodiment

Figure 6A:
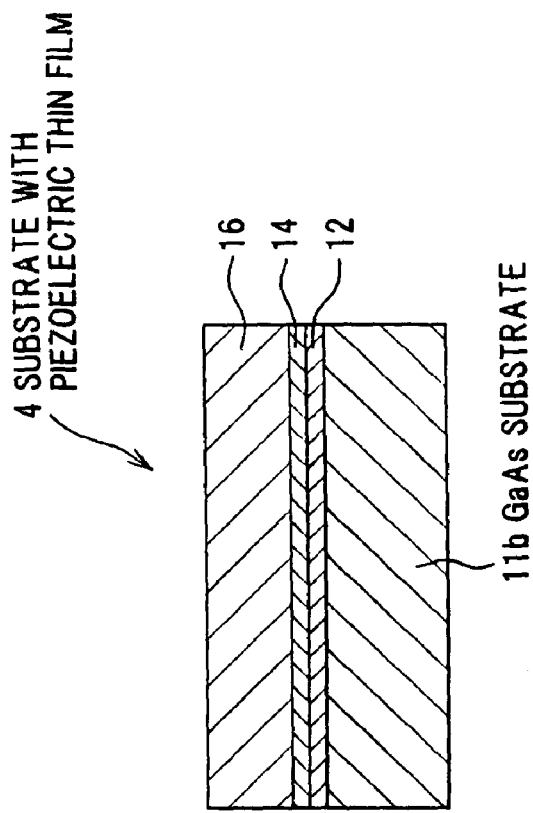
FIG. 6A and FIG. 6B are cross sectional views of a substrate with a piezoelectric thin film in a second preferred embodiment according to the present invention.
Figure 6B:
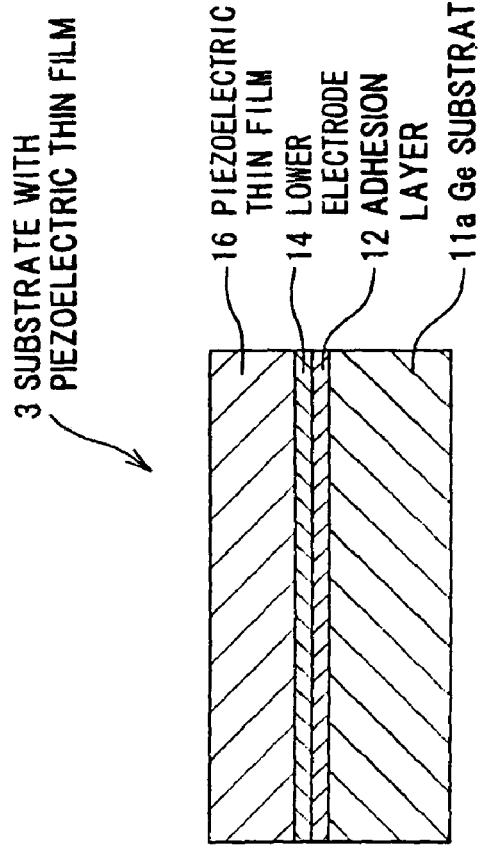

FIG. 6A and FIG. 6B are cross sectional views of the substrate with a piezoelectric thin film in a second preferred embodiment according to the present invention.

A substrate 3 with a piezoelectric thin film and a substrate 4 with a piezoelectric thin film in the second preferred embodiment have substantially same configuration as the substrate 1 with the piezoelectric thin film in the first preferred embodiment, except the point that the Si substrate 10 is replaced with a Ge substrate 11a (in the substrate 3 with the piezoelectric thin film) and a GaAs substrate 11b (in the substrate 4 with the piezoelectric thin film). Therefore, the detailed explanation is omitted except differences.

As shown in FIG. 6A, the substrate 3 with the piezoelectric thin film in the second preferred embodiment comprises a Ge substrate 11a, an adhesion layer 12 formed on the Ge substrate 11a, a lower electrode 14 formed on the adhesion layer 12, and a piezoelectric thin film 16 formed on the lower electrode 14.

Alternatively, as shown in FIG. 6B, the substrate 4 with the piezoelectric thin film in the second preferred embodiment comprises a GaAs substrate 11b, an adhesion layer 12 formed on the GaAs substrate 11b, a lower electrode 14 formed on the adhesion layer 12, and a piezoelectric thin film 16 formed on the lower electrode 14.

In FIG. 6A, the Ge substrate 11a is formed to have a substantially square shape of 20 mm×20 mm in plan view, and a thickness of 0.5 mm, for instance. The Ge substrate 11a has a plane orientation (100).

Similarly, in FIG. 6B, the GaAs substrate 11b is formed to have a substantially square shape of 20 mm×20 mm in plan view, and a thickness of 0.5 mm, for instance. The GaAs substrate 11b has a plane orientation (100).

Here, a thermal expansion coefficient (a second thermal expansion coefficient) of Ge composing the Ge substrate 11a is $6.1 \times 10^{-6}/°$ C. A thermal expansion coefficient (the second thermal expansion coefficient) of GaAs composing the GaAs substrate 11b is $5.7 \times 10^{-6}/°$ C. Therefore, each of the thermal expansion coefficients of the Ge substrate 11a and the GaAs substrate 11b is close to the thermal expansion coefficient ($5.5 \times 10/°$ C. to $6.5 \times 10/°$ C.) of the piezoelectric thin film 16 comprising the potassium sodium niobate.

Figure 7:
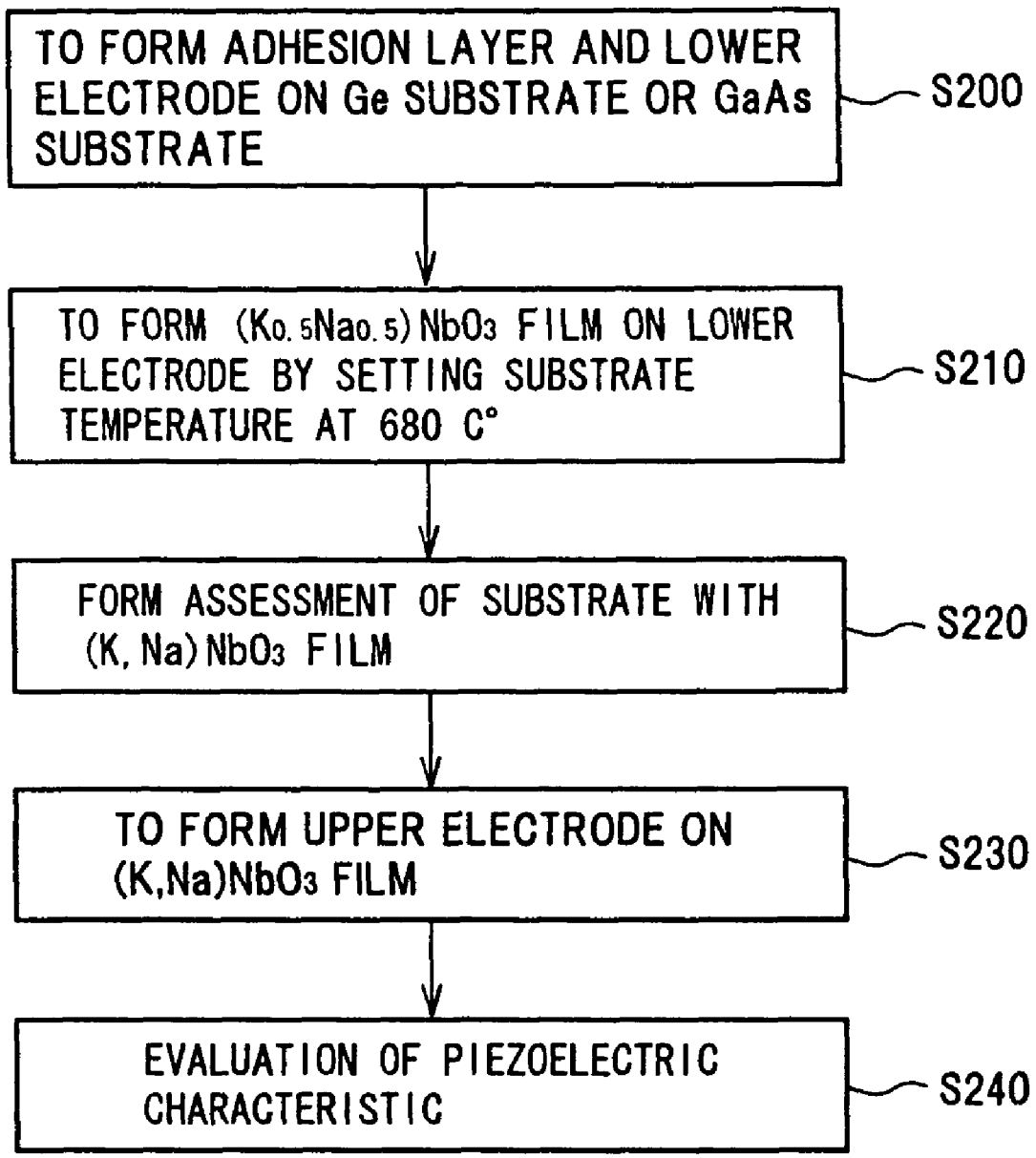
FIG. 7 is a flow chart showing a manufacturing process of the substrate with the piezoelectric thin film and the piezoelectric element, and a characteristic evaluation process thereof in the second preferred embodiment.

FIG. 7 shows a manufacturing process of the substrate with the piezoelectric thin film and the piezoelectric element, and a characteristic evaluation process thereof in the second preferred embodiment.

The substrate 3 with the piezoelectric thin film and the substrate 4 with the piezoelectric thin film in the second preferred embodiment are formed by a substantially same process as the process for forming the substrate 1 with the piezoelectric thin film in the first preferred embodiment. Therefore, the detailed explanation is omitted except differences.

In this preferred embodiment, when forming the piezoelectric thin film 16 comprising (K,Na)NbO₃ on the lower electrode 14 located above the Ge substrate 11a (or the GaAs substrate 11b), the substrate temperature is set to be different from that of the first preferred embodiment. Namely, in the second preferred embodiment, the substrate temperature is set at 680° C. which is within a range of the normal temperature for forming the (K,Na)NbO₃. The other manufacturing process and condition are same as those in the first preferred embodiment.

Figure 8:
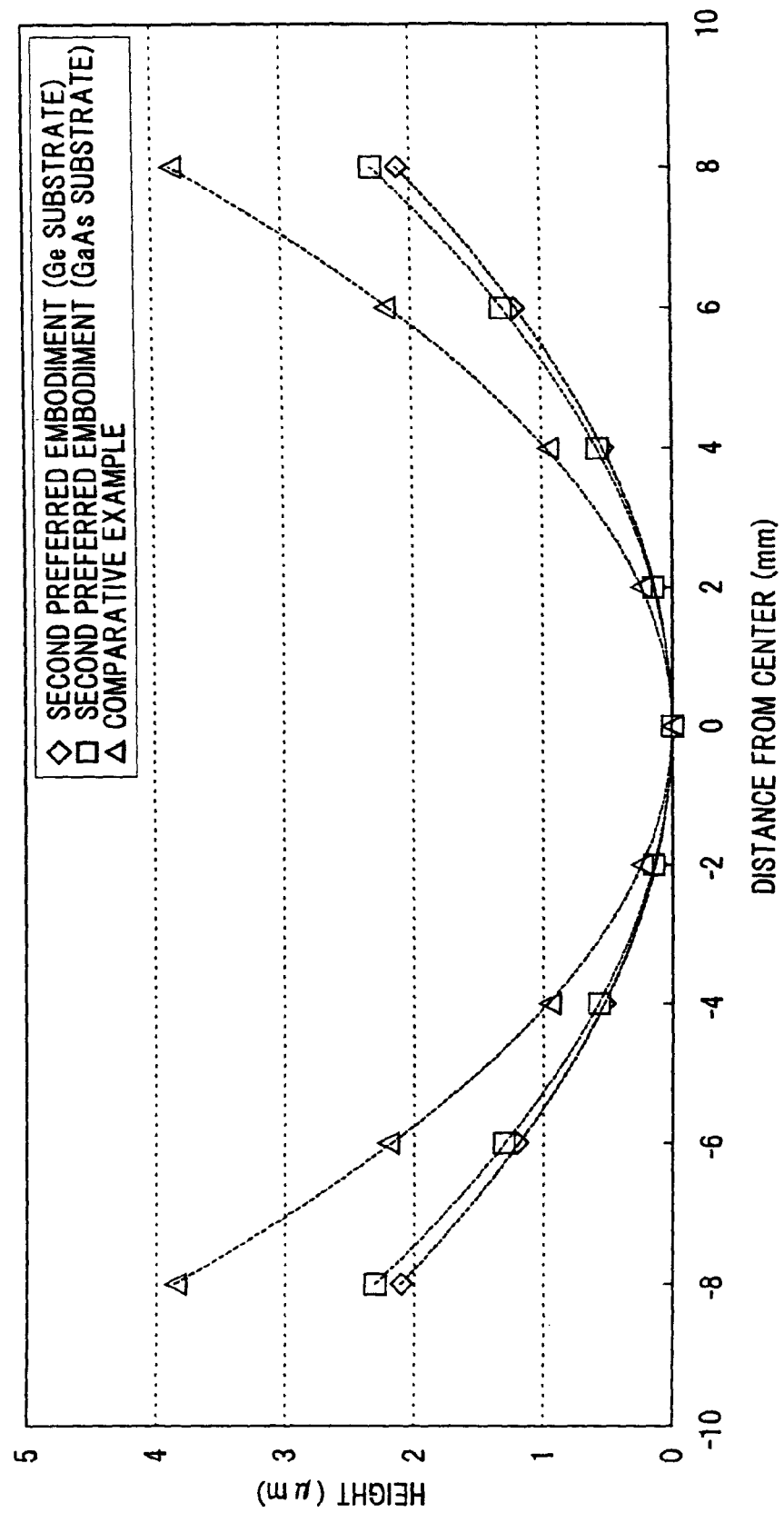
FIG. 8 is a graph chart showing the form assessment result of the substrate with a piezoelectric thin film in the second preferred embodiment and the substrate with the piezoelectric thin film in the comparative example.

FIG. 8 shows the form assessment result of the substrate with a piezoelectric thin film in the second preferred embodiment and the substrate with the piezoelectric thin film in the comparative example.

FIG. 8 shows result of measuring the shape (warping) of the substrate 3 with the piezoelectric thin film and the substrate 4 with the piezoelectric thin film in the second preferred embodiment and the substrate with the piezoelectric thin film in the comparative example by using the laser displacement meter. The substrate with the piezoelectric thin film in the comparative example in the second preferred embodiment is the same as that in the first preferred embodiment.

Referring to FIG. 8, all of the substrates 3, 4 with the piezoelectric thin film in the second preferred embodiment and the substrate with the piezoelectric thin film in the comparative example are warped in a convex shape downwards in an arrangement that the (K,Na)NbO$_3$ film (i.e. the piezoelectric thin film 16) is located upwards (at the top side). Then, a curvature radius of the warping of the substrate 3 with the piezoelectric thin film in the second preferred embodiment is 15.2 m at the room temperature, a curvature radius of the warping of the substrate 4 with the piezoelectric thin film in the second preferred embodiment is 14.0 m at the room temperature, and that of the substrate with the piezoelectric thin film in the comparative example is 8.3 m at the room temperature.

TABLE 3 shows a comparison between the decreasing rate of the piezoelectric constant of the piezoelectric elements in the second preferred embodiment and that of the piezoelectric element in the comparative example.

TABLE 3

| Piezoelectric element | Decreasing rate of piezoelectric constant d$_{31}$ (%) |
| --- | --- |
| The second preferred embodiment (Ge substrate) | 2.2 |
| The second preferred embodiment (GaAs substrate) | 2.9 |
| Comparative example | 7.4 |

On one hand, as for the piezoelectric element in the comparative example, the decreasing rate of the piezoelectric constant d$_{31}$ after 1,000,000,000 times of the flexing action is 7.4%. On the other hand, as for the piezoelectric element formed from the substrate 3 with the piezoelectric thin film in the second preferred embodiment, the decreasing rate of the piezoelectric constant after 1,000,000,000 times of the flexing action is 2.2%. Further, as for the piezoelectric element formed from the substrate 4 with the piezoelectric thin film in the second preferred embodiment, the decreasing rate of the piezoelectric constant after 1,000,000,000 times of the flexing action is 2.9%.

Effect of the Second Preferred Embodiment

In the substrate 3 with the piezoelectric thin film and the substrate 4 with the piezoelectric thin film in the second preferred embodiment according to the present invention, it is possible to remarkably reduce the compressive stress or the tensile stress generated between the Ge substrate 11a (or the GaAs substrate 11b) and the piezoelectric thin film 16 comprising the potassium sodium niobate, since the substrate 3 (or 4) with the piezoelectric thin film in the second preferred embodiment comprises the Ge substrate 11a (or the GaAs substrate 11b) having the thermal expansion coefficient close to that of the potassium sodium niobate film. As a result, it is possible to control the warping of the substrates 3 (or 4) with the piezoelectric thin film, thereby suppressing the increase in the decreasing rate of the piezoelectric constant d$_{31}$ of the piezoelectric element comprising the substrate 3 (or 4) with the piezoelectric thin film.

Although the invention has been described, the invention according to claims is not to be limited by the above-mentioned embodiments. Further, please note that not all combinations of the features described in the embodiment are not necessary to solve the problem of the invention.

What is claimed is:

1. A substrate with a piezoelectric thin film comprising:
   the substrate having a first thermal expansion coefficient; and
   the piezoelectric thin film having a second thermal expansion coefficient and being formed above the substrate, the piezoelectric thin film comprising a potassium sodium niobate expressed by a general formula (K,Na)NbO$_3$ with a perovskite structure,
   wherein a curvature radius of a warping of the substrate provided with the piezoelectric thin film due to a difference between the first and the second thermal expansion coefficients is 10 m or more at a room temperature,
   wherein the piezoelectric thin film has a thickness of 0.2 μm to 10 μm, and
   wherein the piezoelectric thin film is oriented in one of plane orientations (001), (110), and (111).

2. The substrate with the piezoelectric thin film according to claim 1, wherein the substrate comprises a Si substrate.

3. The substrate with the piezoelectric thin film according to claim 1, wherein the substrate comprises a Ge substrate.

4. The substrate with the piezoelectric thin film according to claim 1, wherein the substrate comprises a GaAs substrate.

5. The substrate with the piezoelectric thin film according to claim 1, further comprising:
   a lower electrode between the piezoelectric thin film and the substrate; and
   an upper electrode formed on an opposite surface of the piezoelectric film with respect to a surface contacting with the lower electrode,
   wherein at least one of the upper electrode and the lower electrode contains Pt.

6. The substrate with the piezoelectric thin film according to claim 1, further comprising:
   a layer having a perovskite structure between a lower electrode and the piezoelectric thin film.

7. The substrate with the piezoelectric thin film according to claim 6, wherein the layer having the perovskite structure comprises a compound selected from a group consisting of KNbO$_3$, NaNbO$_3$, LaNiO$_3$, SrRuO$_3$, and SrTiO$_3$.

8. The substrate with the piezoelectric thin film according to claim 1, wherein the piezoelectric thin film comprises (K,Na)NbO$_3$ having a composition within a range of $0.4 \leq$ Na/(K+Na) $\leq 0.75$.

9. The substrate with the piezoelectric thin film according to claim 1, wherein the piezoelectric thin film contains an element other than K, Na, Nb, and O.

10. The substrate with the piezoelectric thin film according to claim 9, wherein a content of the element other than K, Na, Nb, and O in the piezoelectric thin film is 10% or less.

11. The substrate with the piezoelectric thin film according to claim 9, wherein the element other than K, Na, Nb, and O comprises lithium or tantalum.

12. The substrate with the piezoelectric thin film according to claim 1, wherein the first thermal expansion coefficient is from $2.6 \times 10^{-6}/°$ C. to $6.1 \times 10^{-6}/°$ C. and the second thermal expansion coefficient is from $5.5 \times 10^{-6}/°$ C. to $6.5 \times 10^{-6}/°$ C.

* * * * *